(12) United States Patent
Ding

(10) Patent No.: US 10,992,266 B2
(45) Date of Patent: Apr. 27, 2021

(54) CASCODE AMPLIFIER BIAS

(71) Applicant: Advanced Semiconductor Engineering, Inc., Kaohsiung (TW)

(72) Inventor: Jaw-Ming Ding, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 30 days.

(21) Appl. No.: 16/365,370

(22) Filed: Mar. 26, 2019

(65) Prior Publication Data

US 2020/0313626 A1 Oct. 1, 2020

(51) Int. Cl.
| | |
|---|---|
| *H03F 3/04* | (2006.01) |
| *H03F 1/22* | (2006.01) |
| *H03F 3/21* | (2006.01) |
| *H03F 1/30* | (2006.01) |
| *H03F 3/193* | (2006.01) |

(52) U.S. Cl.
CPC ............... *H03F 1/22* (2013.01); *H03F 1/223* (2013.01); *H03F 1/301* (2013.01); *H03F 1/302* (2013.01); *H03F 3/193* (2013.01); *H03F 3/21* (2013.01)

(58) Field of Classification Search
CPC ... H03F 1/22; H03F 3/21; H03F 3/213; H03F 3/195

USPC .......................... 330/277, 296, 311, 302, 285
See application file for complete search history.

(56) References Cited

U.S. PATENT DOCUMENTS

| | | | | |
|---|---|---|---|---|
| 3,986,132 A | * | 10/1976 | Wittlinger | ............... H03F 3/423 330/297 |
| 7,940,125 B2 | * | 5/2011 | Wang | ..................... H03F 1/0266 330/311 |
| 9,479,117 B2 | * | 10/2016 | Wakaki | .................... H03F 1/226 |

\* cited by examiner

*Primary Examiner* — Khanh V Nguyen
*Assistant Examiner* — Khiem D Nguyen
(74) *Attorney, Agent, or Firm* — Foley & Lardner LLP

(57) ABSTRACT

A power amplifier circuit includes a first transistor, a second transistor and a bias circuit. The first transistor has a base configured to receive a first signal. The second transistor has an emitter connecting to a collector of the first transistor and a collector configured to output a second signal. The bias circuit is coupled to the first transistor and the second transistor. The bias circuit is configured to provide a direct current (DC) voltage at the collector of the second transistor about twice a DC voltage at the collector of the first transistor. The bias circuit is configured to provide an alternating current (AC) or radio frequency (RF) voltage at the collector of the second transistor about twice an AC or RF voltage at the collector of the first transistor.

18 Claims, 6 Drawing Sheets

CASCODE AMPLIFIER BIAS

BACKGROUND

1. Technical Field

The present disclosure relates to a power amplifier, and more particularly, to a bias circuit for a power amplifier.

2. Description of the Related Art

A power amplifier is a circuit in a wireless transceiver for amplifying a signal to be transmitted. In general, an impedance conversion matching circuit can be used at the output of the power amplifier for impedance matching. However, the use of the impedance conversion matching circuit can increase the power consumption of the power amplifier. To avoid the higher power consumption, the impedance conversion matching circuit may be omitted by using high voltage supply. However, high breakdown voltage transistors are included. To reduce the withstand voltage of the transistors, a cascode amplifier may be implemented.

SUMMARY

In accordance with an aspect of the present disclosure, a power amplifier circuit includes a first transistor, a second transistor and a bias circuit. The first transistor has a base configured to receive a first signal. The second transistor has an emitter connecting to a collector of the first transistor and a collector configured to output a second signal. The bias circuit is coupled to the first transistor and the second transistor. The bias circuit is configured to provide a direct current (DC) and voltage at the collector of the second transistor about twice a DC voltage at the collector of the first transistor. The bias circuit is configured to provide a radio frequency (RF) voltage at the collector of the second transistor about twice a RF voltage at the collector of the first transistor.

In accordance another aspect of the present disclosure, a power amplifier circuit includes a first transistor, a second transistor and an amplifier. The first transistor is configured in a common emitter arrangement. The second transistor is connected to the first transistor and configured in a common base arrangement. The amplifier has a first input, a second input and an output. The first input of the amplifier is connected to a collector of the second transistor. The second input of the amplifier is connected to an emitter of the second transistor. The output of the amplifier is connected to a base of the second transistor.

Figure 1:
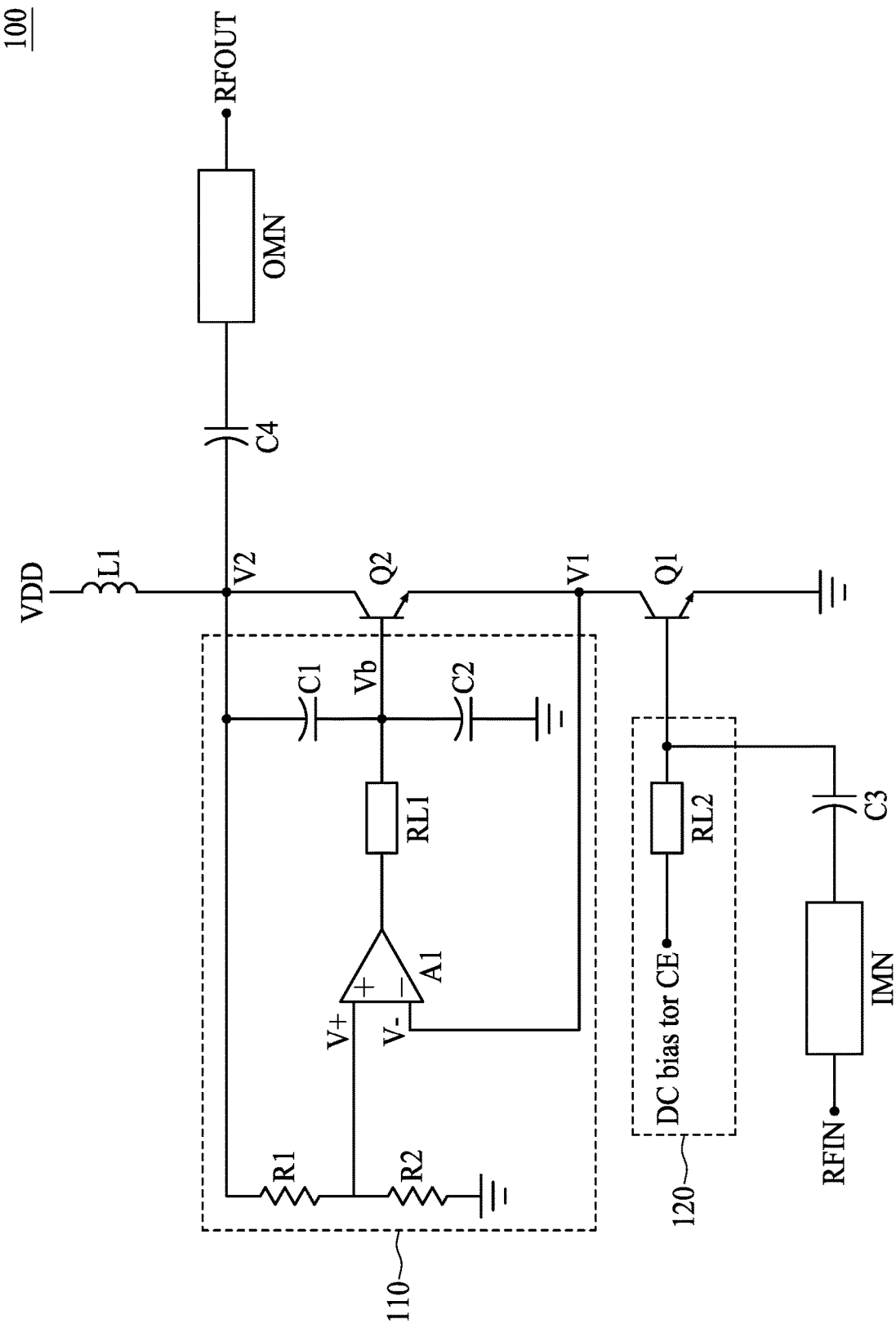
FIG. 1 is a schematic diagram illustrating a power amplifier in accordance with some embodiments of the present disclosure.

Common reference numerals are used throughout the drawings and the detailed description to indicate the same or similar components. The present disclosure can be readily understood from the following detailed description taken in conjunction with the accompanying drawings.

DETAILED DESCRIPTION

Although described with particular reference to a portable transceiver, the circuit and method for biasing a gallium arsenide (GaAs) power amplifier (also referred to as the GaAs bias circuit) can be implemented in any GaAs device in which it is desirable to provide a bias current and voltage. Furthermore, the circuitry described below can be fabricated using an integrated bipolar-field effect transistor (BIFET) process utilizing a lower turn-on voltage of field effect transistors. Furthermore, in particular embodiments, the transistors described below include bipolar junction transistors (referred to as a BJT), which includes heterojunction bipolar junction transistors (referred to as an HBT) and field effect transistors (referred to as a FET) or pseudomorphic high-electron mobility transistors (referred to as a pHEMT) that are fabricated using what is referred to as the BIFET or BiHEMT process. In some embodiments, the transistors described below can be fabricated using what is referred to as the GaAs, indium phosphide (InP), silicon-germanium (SiGe), gallium nitride (GaN), complementary metal-oxide-semiconductor (CMOS), silicon on insulator (SOI) or any other suitable processes.

As used herein, reference to a base, emitter, collector, or other component of a transistor or other circuit component being connected to a base, emitter, collector, or other component of another transistor or other circuit component can refer to a direct connection, or to a connection with another circuit component (e.g. a transistor) disposed therebetween.

FIG. 1 is a schematic diagram illustrating a power amplifier 100 in accordance with some embodiments of the present disclosure. The power amplifier 100 includes bias circuits 110 and 120, transistors Q1 and Q2, an input matching element IMN and an output matching element OMN.

The emitter of the transistor Q1 is connected to a ground (that is, to a ground voltage). The base of the transistor Q1 is connected to receive a direct current (DC) bias (e.g., DC current and/or DC voltage) from the bias circuit 120. In some embodiments, the bias circuit 120 may include a RF-blocked element RL2. In other embodiments, the RF-blocked element RL2 can be omitted. The bias circuit 120 may be any other bias circuits that can provide a DC bias current and/or DC bias voltage. The base of the transistor Q1 is configured to receive a radio frequency (RF) signal from an input RFIN. In some embodiments, the base of the transistor Q1 is connected to the input RFIN through the input matching element IMN and/or a capacitor C3. The collector of the transistor Q1 is connected to a base of the transistor Q2 and the bias circuit 110.

The emitter of the transistor Q2 is connected to the collector of the transistor Q1 and the bias circuit 110. The base of the transistor Q2 is connected to the bias circuit 110. The collector of the transistor Q2 is connected to a bias voltage VDD. In some embodiments, the collector of the transistor Q2 is connected to the bias voltage VDD through an inductor L1. The collector of the transistor Q2 is configured to output an amplified RF signal through the output RFOUT of the power amplifier 100 according to the RF signal received from the input RFIN. In some embodiments, the collector of the transistor Q2 is connected to the output RFOUT through the output matching element OMN and/or a capacitor C4. In some embodiments, the output matching element OMN can be omitted.

In some embodiments, the transistor Q1 is connected or configured in a common emitter (CE) arrangement. The transistor Q2 is connected or configured in a common base (CB) arrangement. The transistor Q1 and the transistor Q2 may be configured or connected to define a cascode amplifier.

The bias circuit 110 includes an amplifier A1, resistors R1, R2, capacitors C1, C2 and a RF-blocked element RL1. The amplifier A1 has a first input (+), a second input (−) and an output. In some embodiments, the amplifier A1 is an operational amplifier or any other suitable differential amplifiers. In some embodiments, the voltage V+ at the first input of the amplifier A1 is substantially the same as the voltage V− at the second input of the amplifier A1. The first input of the amplifier A1 is connected to the resistors R1 and R2. The second input of the amplifier A1 is connected to the collector of the transistor Q1 and the emitter of the transistor Q2. The output of the amplifier A1 is connected to the RF-blocked element RL1. In some embodiments, the RF-blocked element RL1 includes at least one resistor and/or at least one inductor and is connected between the output of the amplifier A1 and the base of the transistor Q2.

The resistor R1 is connected between the first input of the amplifier A1 and the collector of the transistor Q2. The resistor R2 is connected between the second input of the amplifier A2 and a ground. In some embodiments, the resistor R1 and the resistor R2 are connected or configured in series to act as a DC voltage divider. The DC voltage V+ at the first input of the amplifier A1 is related to the DC voltage V2 at the collector of the transistor Q2 according to the ratio between the resistor R1 and the resistor R2. For example, V2 and V+ are in the following relationship:

$$V_+ = V_2 \times \frac{R_2}{R_1 + R_2}. \quad \text{Eq. 1}$$

If R1 is equivalent to R2, the DC voltage V+ at the first input of the amplifier A1 is substantially half of the DC voltage V2 at the collector of the transistor Q2. Since the DC voltage V+ at the first input of the amplifier A1 is substantially the same as the DC voltage V− at the second input of the amplifier A1 and the second input of the amplifier A1 is connected to the collector of the transistor Q1, the DC voltage V1 at the collector of the transistor Q1 is substantially half of the DC voltage V2 at the collector of the transistor Q2. In other words, the DC voltage drop (e.g., V1) across the collector and the emitter of the transistor Q1 is substantially the same as the DC voltage drop (e.g., V2−V1) across the collector and the emitter of the transistor Q2.

The capacitor C1 is connected between the base of the transistor Q2 (and the RF-blocked element) and the collector of the transistor Q2. The capacitor C2 is connected between the base of the transistor Q2 (and the RF-blocked element) and a ground. In some embodiments, an impedance of the capacitor C2 is less than that of the resistor R1. In some embodiments, the capacitor C1 and the capacitor C2 are connected or configured in series to act as a capacitive voltage divider (or RF voltage divider or feedback). The RF voltage (or AC voltage) Vb at the base of the transistor Q2 is related to the RF voltage (or AC voltage) V2 at the collector of the transistor Q2 according to the ratio between the capacitor C1 and C2. For example, V2 and Vb are in the following relationship:

$$V_b = V_2 \times \frac{C_1}{C_1 + C_2}. \quad \text{Eq. 2}$$

If C1 is equivalent to C2, the RF voltage Vb at the base of the transistor Q2 is substantially half of the RF voltage V2 at the collector of the transistor Q2. Since the RF voltage Vb at the base of the transistor Q2 is substantially the same as the RF voltage V1 at the emitter of the transistor Q2, the RF voltage drop (e.g., V1) across the collector and the emitter of the transistor Q1 is substantially the same as the RF voltage drop (e.g., V2−V1) across the collector and the emitter of the transistor Q2.

In some embodiments, the transistors Q1 and Q2 illustrated in FIG. 1 can be implemented by using FETs, HEMTs, PHEMTs, MOS or any other suitable transistors. In those embodiments, the transistor Q1 is connected or configured in a common source (CS) arrangement, and the transistor Q2 is connected or configured in a common emitter (CE) arrangement. Since the CE arrangement transistor Q2 has an input capacitor Cin at the gate of the transistor Q2, the capacitor C2 and the input capacitor Cin are arranged in parallel. Therefore, the capacitor C1 should be equivalent to (C2+Cin) to ensure that the RF voltage Vb at the gate of the transistor Q2 is substantially half of the RF voltage V2 at the emitter of the transistor Q2.

In accordance with some embodiments of the present disclosure, the amplifier A1 and the registers R1 and R2 are configured to provide a DC feedback for the bias circuit 110, and the capacitors C1 and C2 are configured to provide a RF feedback for the bias circuit 110. The bias circuit 110 is configured to allow the RF and DC voltage drop across the collector and the base of the transistor Q1 to be substantially the same as the RF and DC voltage drop across the collector and the base of the transistor Q2, so that both the RF and DC power consumption of the transistor Q2 are substantially the same as those of the transistor Q1, which would in turn reduce the chip area and the manufacturing cost of the power amplifier 100. In addition, since the bias circuit 110 is configured to maintain the RF and DC voltage drop across the transistor Q1 to be the same as that across the transistor Q2, the current flowing through the transistor Q1 is substantially the same as that flowing through the transistor Q2 no matter how the DC bias at the base of the transistor Q1 changes, which would increase the reliability and stability of the power amplifier 100.

Figure 2:
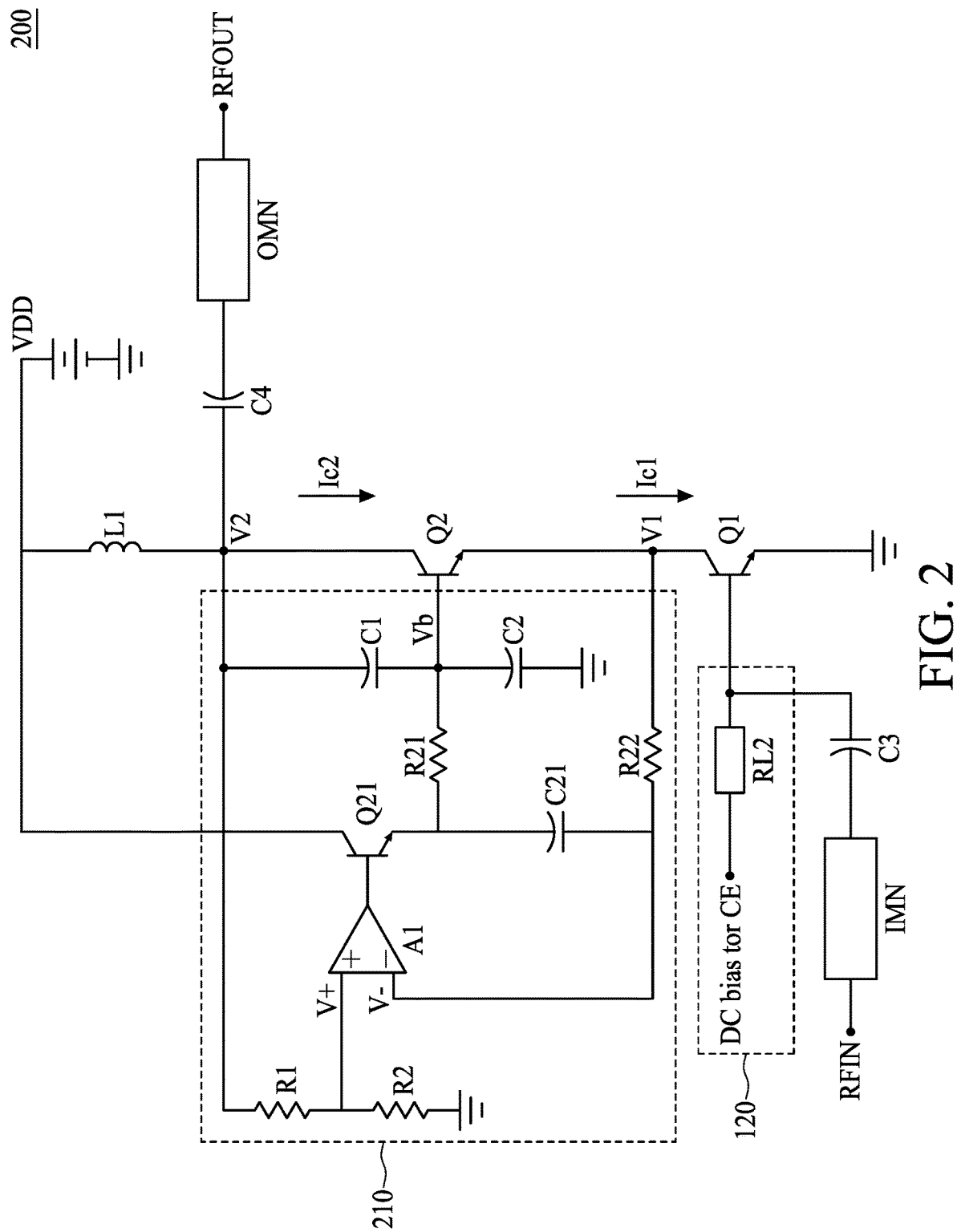
FIG. 2 is a schematic diagram illustrating a power amplifier in accordance with some embodiments of the present disclosure.

FIG. 2 is a schematic diagram illustrating a power amplifier 200 in accordance with some embodiments of the present disclosure. The power amplifier 200 is similar to the power amplifier 100 in FIG. 1, except that the bias circuit 210 of the power amplifier 200 further includes a transistor Q21, a capacitor C21, resistors R21 and R22.

The collector of the transistor Q21 is connected to the bias voltage VDD. The base of the transistor Q21 is connected to the output of the amplifier A1. The emitter of the transistor Q21 is connected to the resistor R21 and the capacitor C21. The resistor R21 is connected between the emitter of the transistor Q21 and the base of the transistor Q2. The capacitor C21 is connected between the emitter of the transistor Q21 and the second input of the amplifier A1. The resistor R22 is connected between the second input of the amplifier A1 and the emitter of the transistor Q2.

Figure 3A:
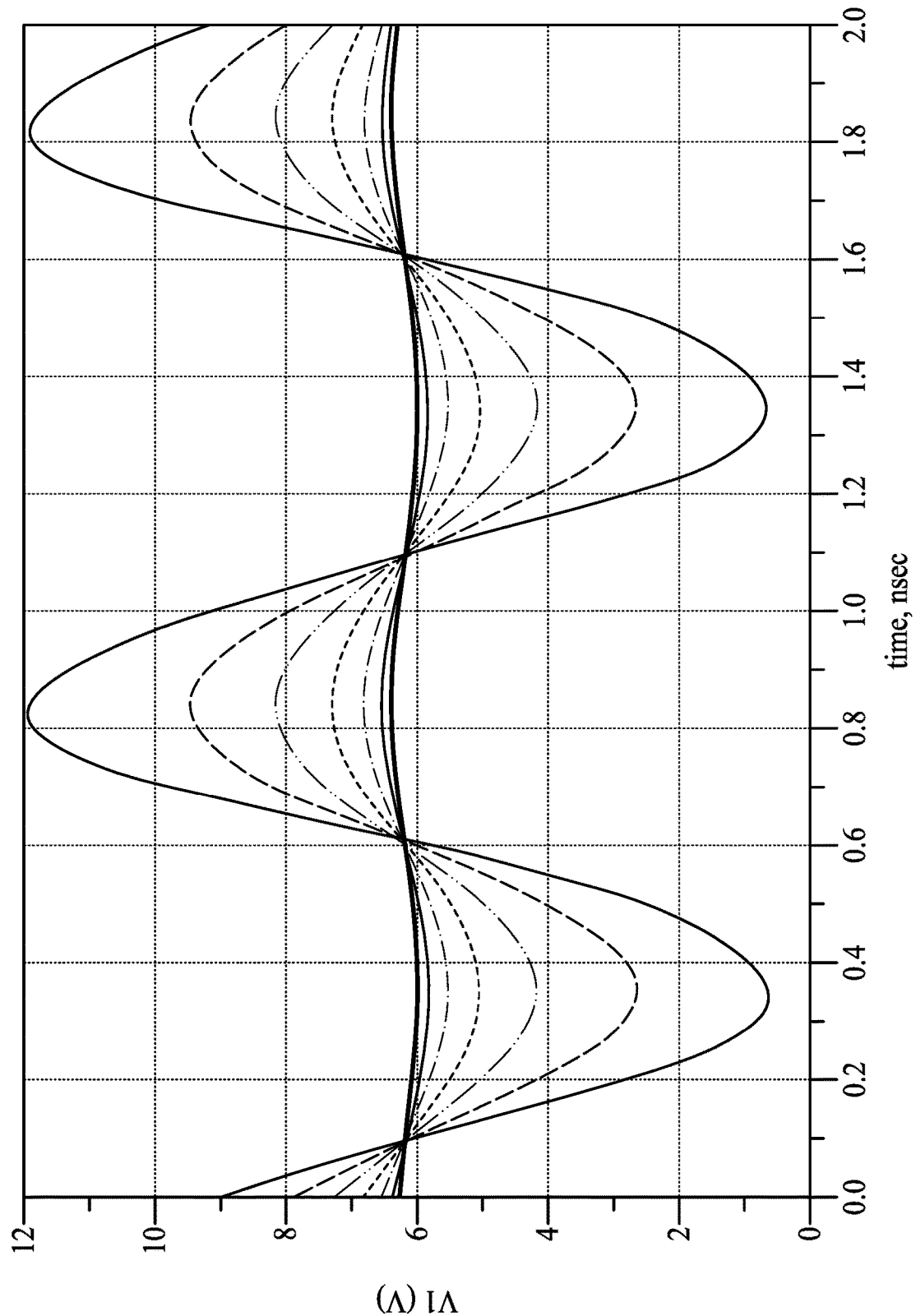
FIG. 3A, FIG. 3B, FIG. 3C and FIG. 3D illustrate simulation results of the power amplifier shown in FIG. 2 in accordance with some embodiments of the present disclosure.
Figure 3B:
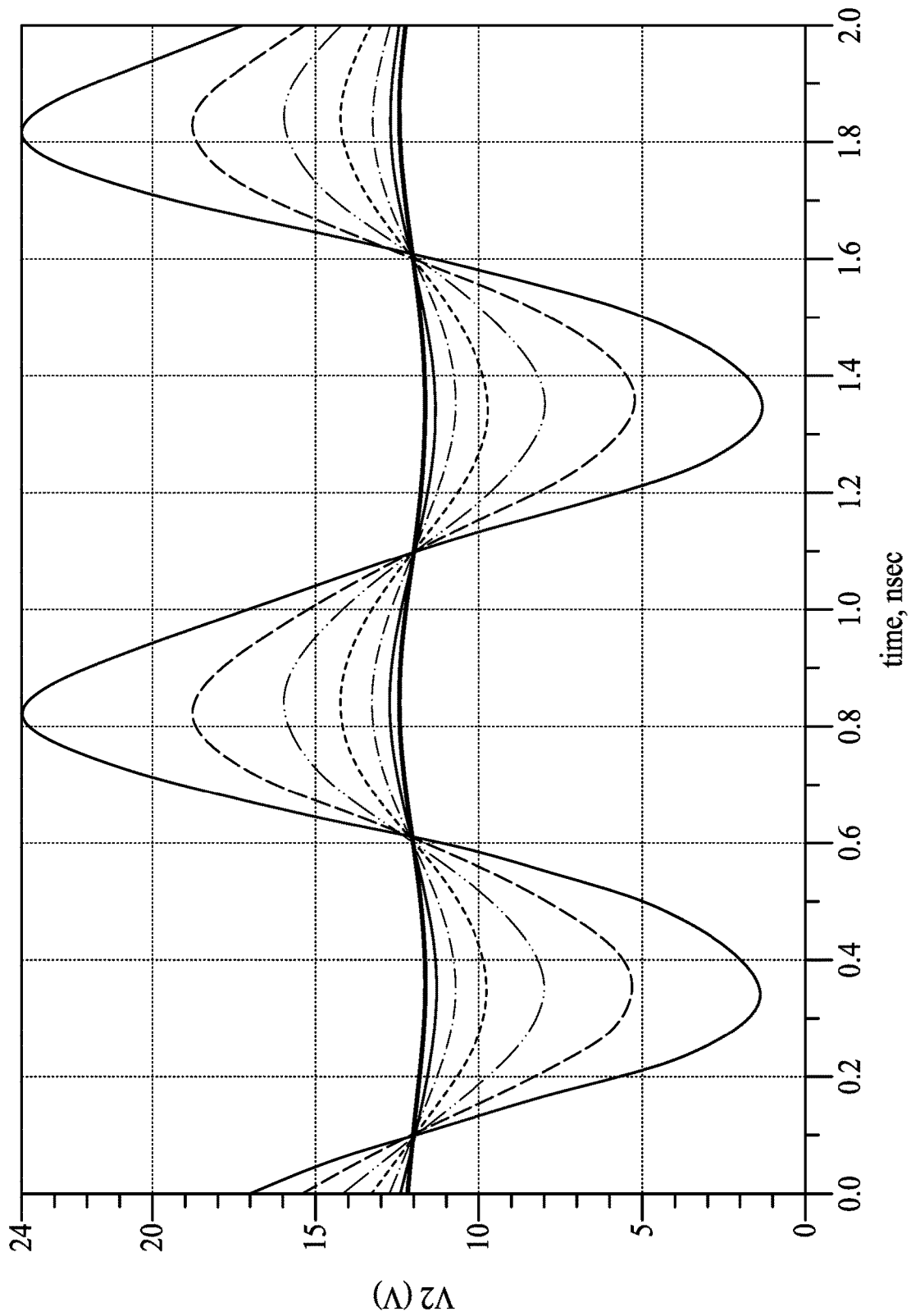
Figure 3C:
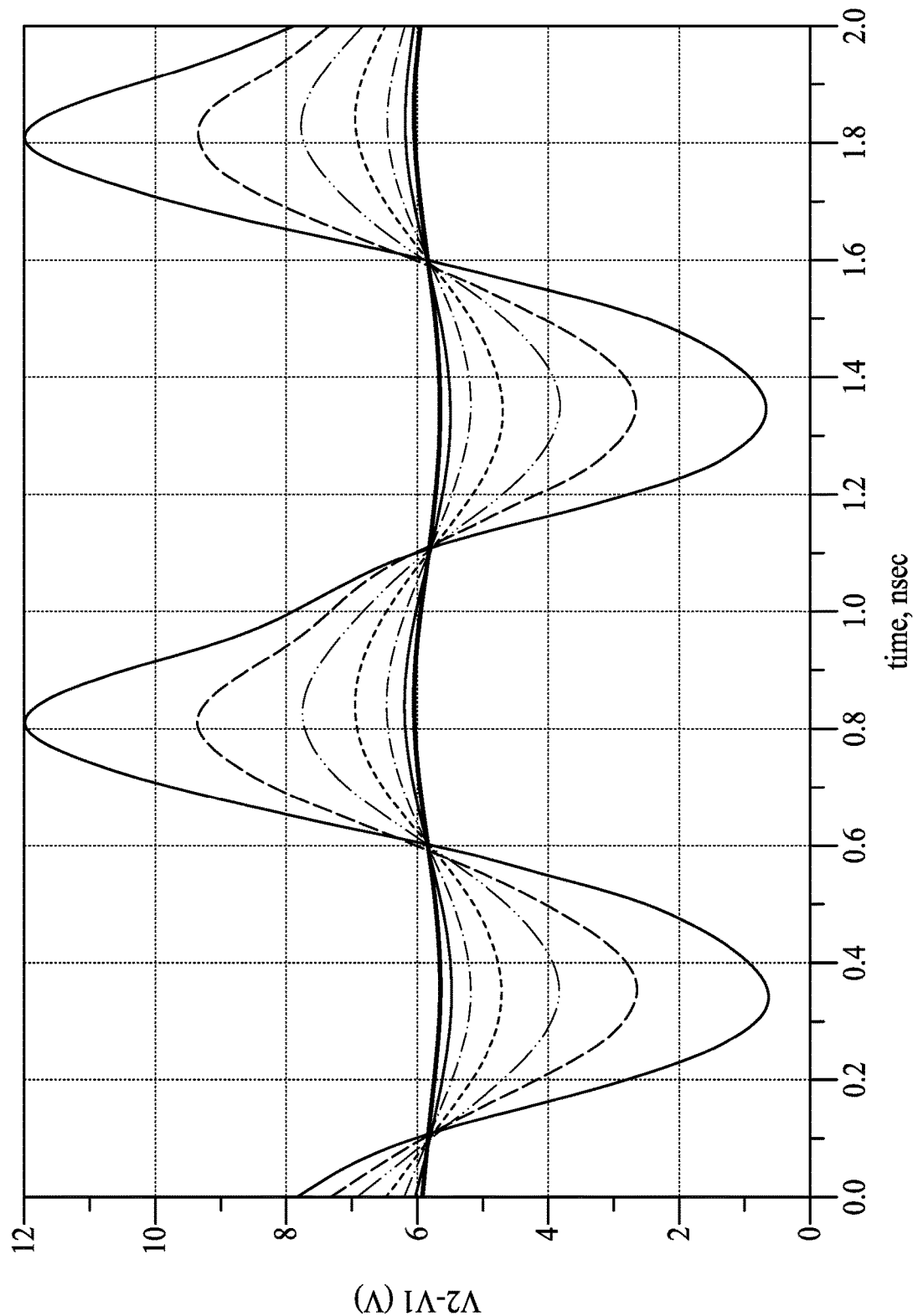
Figure 3D:
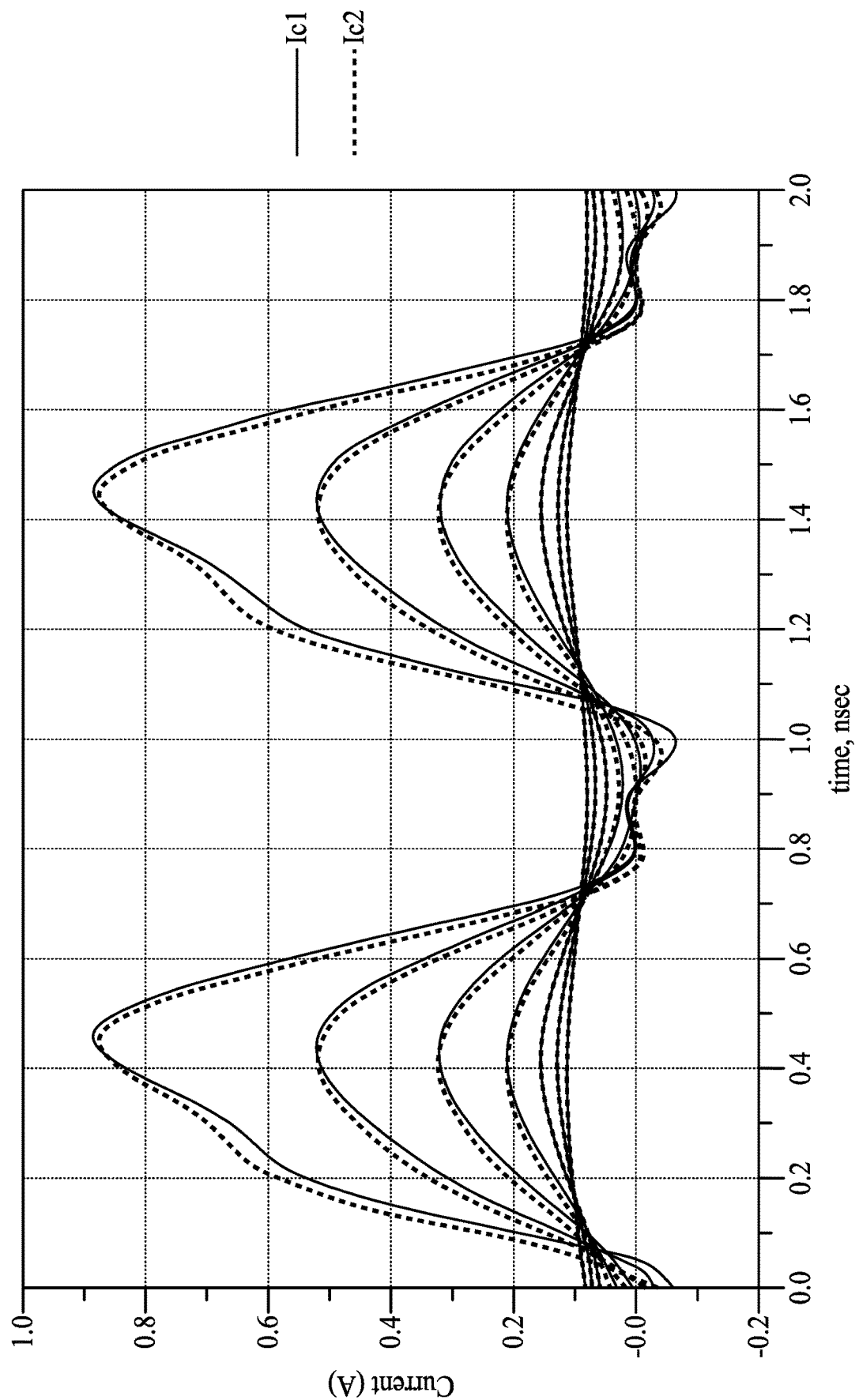

FIGS. 3A, 3B, 3C and 3D illustrate simulation results of the power amplifier 200 shown in FIG. 2 in accordance with some embodiments of the present disclosure. In FIG. 3A, the x-axis represents the time (nanosecond, nsec) and the y-axis represents the voltage V1 (a sum of the DC voltage and the RF voltage) at the collector of the transistor Q1 with different RF input voltages or power level at the base of the transistor Q1. In FIG. 3B, the x-axis represents the time (nsec) and the y-axis represents the voltage V2 (a sum of the DC voltage and the RF voltage) at the collector of the transistor Q2 with different RF input voltages or power level at the base of the transistor Q1. In FIG. 3C, the x-axis represents the time (nsec) and the y-axis represents the voltage (V2−V1) (a sum of the DC voltage and the RF voltage) with different RF input voltages or power level at the base of the transistor Q1. In FIG. 3D, the x-axis represents the time (nsec) and the y-axis represents the current (a sum of the DC current and the RF current) Ic1 of the collector of the transistor Q1 and the current (a sum of the DC current and the RF current) Ic2 of the collector of the transistor Q2 with different RF input voltages or power level at the base of the transistor Q1.

As shown in FIGS. 3A, 3B and 3C, the voltage V1 (a sum of the DC voltage and the RF voltage) at the collector of the transistor Q1 is substantially half of the voltage V2 (a sum of the DC voltage and the RF voltage) at the collector of the transistor Q2, and the voltage drop (V1) across the transistor Q1 is substantially the same as the voltage drop (V2−V1) across the transistor Q2 no matter how the RF input voltages or power level at the base of the transistor Q1 changes. In addition, as shown in FIG. 3D, the current Ic1 (a sum of the DC current and the RF current) of the collector of the transistor Q1 is substantially the same as the current Ic2 (a sum of the DC current and the RF current) of the collector of the transistor Q2. Therefore, the power consumption (a sum of the DC power consumption and the RF power consumption) of the transistor Q1 is substantially the same as the power consumption (a sum of the DC power consumption and the RF power consumption) of the transistor Q2, which would in turn reduce the chip area and the manufacturing cost of the power amplifier 200.

As used herein, the singular terms "a," "an," and "the" may include a plurality of referents unless the context clearly dictates otherwise.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "approximately" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A power amplifier circuit comprising:
   a first transistor including a base configured to receive a first signal;
   a second transistor including an emitter connecting to a collector of the first transistor and a collector configured to output a second signal; and
   a bias circuit coupling to the first transistor and the second transistor,
   wherein the bias circuit is configured to generate a direct current (DC) voltage at the collector of the second transistor about twice a DC voltage at the collector of the first transistor; and
   wherein the bias circuit is configured to generate a radio frequency (RF) voltage at the collector of the second transistor about twice a RF voltage at the collector of the first transistor,
   wherein the bias circuit further comprises a DC feedback circuit including:
      an amplifier including a first input, a second input and an output, the output connected to a base of the second transistor;
      a first resistor connected between the collector of the second transistor and the first input of the amplifier; and
      a second resistor connected between the first input of the amplifier and ground.

2. The power amplifier circuit of claim 1, wherein the collector of the second transistor is connected to receive a DC bias voltage.

3. The power amplifier circuit of claim 1, wherein the bias circuit further comprises a RF feedback circuit including:
   a first capacitor connected between the collector of the second transistor and the base of the second transistor; and
   a second capacitor connected between the base of the second transistor and ground.

4. The power amplifier circuit of claim 3, wherein the bias circuit further comprises a DC feedback circuit including:
an amplifier including a first input and an output, the output connected to a base of the second transistor;
a first resistor connected between the collector of the second transistor and the first input of the amplifier; and
wherein an impedance of the first resistor is greater than that of the second capacitor.

5. The power amplifier circuit of claim 1, wherein the bias circuit further comprises a RF-blocked element connected between the output of the amplifier and the base of the second transistor.

6. The power amplifier circuit of claim 5, wherein the RF-blocked element including at least one resistor and one inductor.

7. A power amplifier circuit comprising:
a first transistor configured in a common emitter arrangement;
a second transistor connected to the first transistor and configured in a common base arrangement;
an amplifier including a first input, a second input and an output;
a first resistor connected between the collector of the second transistor and the first input of the amplifier; and
a second resistor connected between the first input of the amplifier and ground,
wherein the first input of the amplifier is connected to a collector of the second transistor, the second input of the amplifier is connected to an emitter of the second transistor and the output of the amplifier is connected to a base of the second transistor.

8. The power amplifier circuit of claim 7, wherein the collector of the second transistor is connected to receive a DC bias voltage.

9. The power amplifier circuit of claim 7, further comprising:
a first capacitor connected between the collector of the second transistor and the base of the second transistor; and
a second capacitor connected between the base of the second transistor and ground.

10. The power amplifier circuit of claim 7, further comprising a first element including at least one resistor and one inductor, wherein the first element is connected between the output of the amplifier and the base of the second transistor.

11. The power amplifier circuit of claim 7, wherein the collector of the second transistor is connected to an output matching element.

12. The power amplifier circuit of claim 7, wherein
an emitter of the first transistor is connected to ground; and
a base of the first transistor is connected to a DC bias circuit and a RF input.

13. The power amplifier circuit of claim 12, further comprising a second element including at least one resistor and one inductor, wherein the second element is connected between the base of the first transistor and the DC bias circuit.

14. The power amplifier circuit of claim 7, wherein a base of the first transistor is connected to an input matching element.

15. The power amplifier circuit of claim 7, wherein a DC voltage difference between the collector and the emitter of the second transistor is substantially the same as a DC voltage difference between a collector and an emitter of the first transistor.

16. The power amplifier circuit of claim 7, wherein a DC voltage at the collector of the second transistor is about twice a DC voltage at a collector of the first transistor.

17. The power amplifier circuit of claim 7, wherein a RF voltage difference between the collector and the emitter of the second transistor is substantially the same as a RF voltage difference between a collector and an emitter of the first transistor.

18. The power amplifier circuit of claim 7, wherein a RF voltage at the collector of the second transistor is about twice a RF voltage at a collector of the first transistor.

* * * * *